US011555845B2

(12) United States Patent
Rowell et al.

(10) Patent No.: US 11,555,845 B2
(45) Date of Patent: Jan. 17, 2023

(54) MEASUREMENT SYSTEM

(71) Applicant: Rohde & Schwarz GmbH & Co. KG, Munich (DE)

(72) Inventors: Corbett Rowell, Munich (DE); Benoit Derat, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/220,740

(22) Filed: Apr. 1, 2021

(65) Prior Publication Data

US 2022/0317176 A1 Oct. 6, 2022

(51) Int. Cl.
| | | |
|---|---|---|
| *G01R 1/04* | (2006.01) | |
| *G01R 1/067* | (2006.01) | |
| *G01R 1/073* | (2006.01) | |
| *G01R 31/28* | (2006.01) | |
| *G01B 7/14* | (2006.01) | |
| *G01B 7/30* | (2006.01) | |

(52) U.S. Cl.
CPC .......... *G01R 31/2822* (2013.01); *G01R 1/04* (2013.01)

(58) Field of Classification Search
CPC .......... G01R 1/04; G01R 1/067; G01R 1/073; G01R 31/28; G01R 31/2822; G01B 7/14; G01B 7/30; G01B 21/042; G01B 21/045
See application file for complete search history.

(56) References Cited

U.S. PATENT DOCUMENTS 10,292,777 B1 * 5/2019 Adelman ............... A61B 34/25

FOREIGN PATENT DOCUMENTS

JP       S60153605 A     8/1985

\* cited by examiner

*Primary Examiner* — Neel D Shah
(74) *Attorney, Agent, or Firm* — Christensen O'Connor Johnson Kindness PLLC

(57) ABSTRACT

A measurement system for performing measurements. The measurement system includes a positioning system for positioning at least one device to be positioned. The positioning system includes at least two rotational positioner modules configured to perform a rotational movement, thereby rotating the device to be positioned, as well as at least one linear positioner module configured to perform a linear movement, thereby translationally moving the device to be positioned. The linear positioner module includes a mounting interface for the device to be positioned. The rotational positioner modules and the linear positioner module together are configured to move the device to be positioned from a starting point of the movement. The rotational positioner modules are configured to set the starting point. The linear positioner module is configured to move the mounting interface relative to the starting point.

20 Claims, 1 Drawing Sheet

MEASUREMENT SYSTEM

FIELD OF THE DISCLOSURE

Embodiments of the present disclosure relate generally to a measurement system for performing measurements of a device under test.

BACKGROUND

In the state of the art, measurement systems for performing measurements of a device under test are known, wherein the measurement systems typically comprise an anechoic chamber that encompasses the device under test. In the anechoic chamber, antennas as well as reflectors are provided that are used for directing signals used for the measurements towards the device under test. In addition, it is known that the device under test is held by a positioning system that is configured to move the device under test during the measurements/testing such that the device under test reaches several different test positions at which a certain measurement is performed.

A classical positioning system comprises two rotational positioner modules such that the device under test can be rotated about two rotational axes, for instance azimuth and elevation or rather $\theta$ and $\varphi$.

However, in case of a positioning system that has two rotational axes, it is not possible for a certain measurement point that is offset from the center of the coordinate system to simultaneously receive two or more signals at different angles of arrival (AoA). This is caused by the standardized method of antenna measurements according to which it is assumed that the device under test is located in the center such that any offset from the center is associated with a measurement uncertainty.

Therefore, it is known from the state of the art to use a positioning system having three angular positioners, namely three rotational positioners, that are enabled to rotate the device under test about three axes. These positioning systems are also known as three axes positioning systems that have three rotational positioners, for instance $\theta$, $\varphi$ and $\theta$ or rather $\varphi$, $\theta$ and $\varphi$.

Generally, the positioning systems with three rotational positioners can be used to perform measurements of the device under test with more than one signal at different angles of arrival simultaneously.

However, the existing solutions are cost-expensive and require a certain space.

Accordingly, there is a need for a cost-efficient and compact solution to perform measurements on the device under test by a measurement system that uses a positioning system, thereby enabling reception of two or more signals at different angles of arrival simultaneously.

SUMMARY

Embodiments of the present disclosure provide a measurement system for performing measurements. In an embodiment, the measurement system comprises a positioning system for positioning at least one device to be positioned. The positioning system comprises at least two rotational positioners, such as two rotational positioner modules, configured to perform a rotational movement, thereby rotating the device to be positioned, as well as at least one linear positioner, such as a linear positioner module, configured to perform a linear movement, thereby translationally moving the device to be positioned. The linear positioner module comprises a mounting interface for the device to be positioned. The rotational positioner modules and the linear positioner module together are configured to move the device to be positioned from a starting point of the movement. The rotational positioner modules are configured to set the starting point. The linear positioner module is configured to move the mounting interface relative to the starting point.

Further, embodiments of the present disclosure provide a measurement system for performing measurements. In an embodiment, the measurement system comprises a positioning system for positioning at least one device to be positioned. The positioning system comprises at least two rotational positioners, such as two rotational positional modules, configured to perform a rotational movement, thereby rotating the device to be positioned, as well as at least one linear positioner, such as a linear positioner module, configured to perform a linear movement, thereby translationally moving the device to be positioned. The linear positioner module comprises a mounting interface for the device to be positioned. The linear positioner module is located within the rotational positioner modules. The measurement system is configured to perform measurements of two signals at two different angles of arrival.

Generally, the positioning system ensures that different measurement points located on a sphere can be reached during a measurement performed by the measurement system. The device to be positioned can be moved by the positioning system to any three-dimensional point in a Cartesian coordinate system, wherein a coordinate transformation from the Cartesian coordinates to spherical coordinates can be performed by a mathematical method. In other words, each point in the three-dimensional Cartesian space, for example the ones not located in the center of a quiet zone established, can be mapped into a three-dimensional spherical coordinate system associated with the positioning system.

In some embodiments, the respective coordinate transformation from the Cartesian coordinate system (x, y, z) can be done by the following equations:

$$\varphi = \tan^{-1}\frac{x}{y}$$
$$\theta = \tan^{-1}\frac{z}{\sqrt{x^2+y^2}}$$
$$r = \sqrt{x^2+y^2+z^2}$$

In some embodiments, the linear positioner module is used to adjust the radius accordingly.

In some embodiments, the respective coordinate transformation is linear such that the transformation associated with the angles and the transformation association with the translation can be performed in different orders.

Since the linear positioner module comprises the mounting interface, the device to be rotated, for instance the device under test, is held by the linear positioner module rather than the rotational positioner modules. Accordingly, the linear positioner module is located inside the rotational positioner modules such that the rotational positioner modules also rotate the linear positioner module provided that the rotational positioner modules rotate the device to be positioned, e.g. the device under test.

Accordingly, a compact and cost-efficient measurement system is provided since the linear positioner module is located within the rotational positioner modules that encompass a certain space for rotating the device to be positioned. Thus, the positioning system can be used in measurement systems that provide less space for the positioning system.

Furthermore, a cable twisting can be avoided, as no third rotational positioner is provided. Nevertheless, the device to be positioned can reach each and every three-dimensional Cartesian point, thereby ensuring a coordinate transformation into spherical coordinates.

The at least two rotational positioner modules are configured to perform a rotational movement of the device to be positioned about different axes, for example axes that are perpendicular with respect to each other. In some embodiments, the rotational positioner modules each include a manually adjustable rotational stage and/or an electronically controllable rotational stage.

An aspect provides that the measurement system is configured to perform measurements of two signals at two different angles of arrival. Thus, the measurement uncertainty can be reduced, as any offset from the center of the respective coordinate system is not associated with the measurement uncertainty anymore compared to a positioning system that uses two rotational positioners. Therefore, the measurements of the device under test can be done in a more precise or rather accurate manner. In addition, a compact positioning system is provided that ensures to perform measurements of two signals at two different angles of arrival simultaneously.

The linear positioner module may be located within the rotational positioner modules. As discussed above, the linear positioner module is the positioner module that is located closer to the device to be positioned compared to rotational positioner modules since the linear positioner module comprises the mounting interface via which the device to be rotated is mounted to the positioning system for positioning purposes. In some embodiments, the linear positioner module includes a manually adjustable linear stage and/or an electronically controllable linear stage.

Another aspect provides that the positioning system is configured to move the device to be positioned to any three-dimensional Cartesian point. The positioning system with the two rotational positioner modules as well as the linear positioner module is generally configured to move the device to be positioned to each point in a space associated with the positioning system, e.g. each point in the Cartesian coordinate system. In some embodiments, the two rotational positioner modules can be used to set the angles elevation and azimuth or rather $\theta$ and $\varphi$, whereas the linear positioner module is enabled to set the radius accordingly, thereby ensuring that each and every point can be reached.

Furthermore, at least one of the rotational positioner modules may be configured to position the starting point in at least one of azimuth direction and elevation direction. Thus, the two rotational positioner modules may be associated with the angles azimuth and elevation. For instance, a first rotational positioner module is associated with azimuth, whereas the second rotational positioner module is associated with elevation. Thus, both rotational positioner modules together ensure that the device to be positioned can be rotated in the azimuth direction and the elevation direction, namely about the respective axes.

A further aspect provides that the linear positioner module is mechanically connected with at least one of the rotational positioner modules such that the linear positioner module is moved by the respective rotational positioner module. Since the linear positioner module comprises the mounting interface for the device to be positioned and the linear positioner module is located within the rotational positioner modules, it is also ensured that the linear positioner module is mechanically connected with at least one of the rotational positioner modules, namely the inner one of the rotational positioner modules or rather the one that is located closer to the device to be positioned.

According to an embodiment, the linear positioner module is directly connected with the rotational positioner module configured to perform the rotational movement along the azimuth direction, wherein the rotational positioner module configured to perform the rotational movement along the azimuth direction is directly connected with the rotational positioner module configured to perform the rotational movement along the elevation direction. In other words, the rotational positioner module configured to perform the rotation movement along the elevation direction, namely the first rotation positioner module, is the outermost one, whereas the rotational positioner module configured to perform the rotational movement along the azimuth direction, namely the second rotational positioner module, is the interposed positioner module, as the linear positioner module is the inner positioner module that is located closer to the device to be positioned in comparison to the other positioner modules.

In an alternative embodiment, the linear positioner module is directly connected with the rotational positioner module configured to perform the rotational movement along the elevation direction, wherein the rotational positioner module configured to perform the rotational movement along the elevation direction is directly connected with the rotational positioner module configured to perform the rotational movement along the azimuth direction. Thus, the outermost positioner module is associated with the rotational positioner module configured to perform the rotational movement along the azimuth direction, whereas the rotational positioner module configured to perform the rotational movement along the elevation direction corresponds to the interposed positioner module. In any case, the linear positioner module is the innermost positioner module that is used for holding the device to be positioned.

In some embodiments, the first rotational positioner module may rotate the second rotational positioner module and the linear positioner module together with the device to be positioned, whereas the second rotational positioner module may rotate the linear positioner module together with the device to be positioned, and wherein the linear positioner module only linearly moves the device to be positioned.

In some embodiments, the mounting interface may be configured to directly hold the device to be positioned. Thus, the mounting interface directly interacts with the device to be positioned such that the device to be positioned is placed on the mounting interface.

Alternatively, the mounting interface may be configured to be engaged by a holding member that is configured to hold the device to be positioned. The holding member may correspond to a coupling or rather adapter module that is connected with the mounting interface such that the device to be positioned is held by the holding member or rather placed on the coupling or rather adapter module.

The at least one device to be positioned may correspond to a device under test or a radio frequency receiving device used for testing a device under test or a radio frequency transmitting device used for testing a device under test. Generally, the device under test may correspond to a radio frequency receiving device, a radio frequency transmitting device or rather a radio frequency transceiver. Typically, the device under test is positioned by the positioning system while transmitting and/or receiving signals.

The measurement system may further comprise a control equipment that includes, inter alia, control circuitry that is connected to the rotational positioner modules and the linear positioner module. The control equipment is configured to output control signals, thereby controlling the rotational positioner modules and the linear positioner module upon receipt of the control signals. The respective controlling may be done during the measurement or rather the testing of the device under test such that the device under test is moved to different measurement positions at which the respective measurements are performed for characterizing the device under test.

Further, a plurality of measurement antennas may be provided. The measurement antennas may be used for testing the device to be positioned, e.g. the device under test. The measurement antennas can be used for transmitting radio frequency signals towards the device under test or rather to receive radio frequency signal emitted by the device under test.

Another aspect provides that a signal generation and/or analysis equipment is provided that is configured to generate measurement signals to be emitted via the measurement antennas and/or to analyze measurement signals received via the measurement antennas. The signal generation and/or analysis equipment is used to control the measurements to be performed and/or to analyze the signals received in order to characterize the device to be rotated, e.g. the device under test. In order to carry out this functionality or others described herein, the signal generation and/or analysis equipment includes circuitry (e.g., hardware circuits, software circuits, or combinations thereof).

Further, the analysis equipment may be configured to perform a coordinate transformation from Cartesian coordinates to spherical coordinates based on two rotation angles associated with the rotational positioner modules and a radius associated with the linear positioner module. As discussed above, the analysis equipment may be used to perform the respective coordinate transformation.

In some embodiments, the measurement system further comprises a test chamber, wherein the rotational positioner modules and the linear positioner module are located within the test chamber. The test chamber may relate to an anechoic chamber that is used to shield the inner space encompassed by the test chamber from the environment, thereby obtaining a testing environment within the test chamber that is not disturbed.

In some embodiments, at least one reflector may be provided that is orientated towards the mounting interface. The reflector is used to reflect signals emitted from the device held by the mounting interface towards the measurement antenna(s) for analyzing purposes. However, the reflector is also used to reflect signals emitted by the measurement antenna(s) towards the device under test. Hence, a signal path between the device under test and the measurement antenna(s) is established by the reflector that reflects the radio frequency signals appropriately.

The at least one reflector may be arranged at an inner wall of a test chamber that encompasses the rotational positioner modules and the linear positioner module. The reflector may be arranged at the wall in a fixed manner. Alternatively, the reflector may be connected to the inner wall by a joint such that its relative position to a surface of the inner wall can be altered, e.g. by a swivel movement of the reflector with respect to the inner wall.

For instance, two measurement antennas may be orientated towards the at least one reflector. The at least two measurement antennas may be offset with respect to a focal point of the reflector such that multiple signals impinge on the device under test at different angles of arrival even though the respective signals are reflected by the same reflector.

Alternatively more than one reflector may be provided that is associated with the respective measurement antennas such that the signals emitted by the measurement antennas are reflected by the corresponding reflectors towards the device to be positioned, e.g. the device under test.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
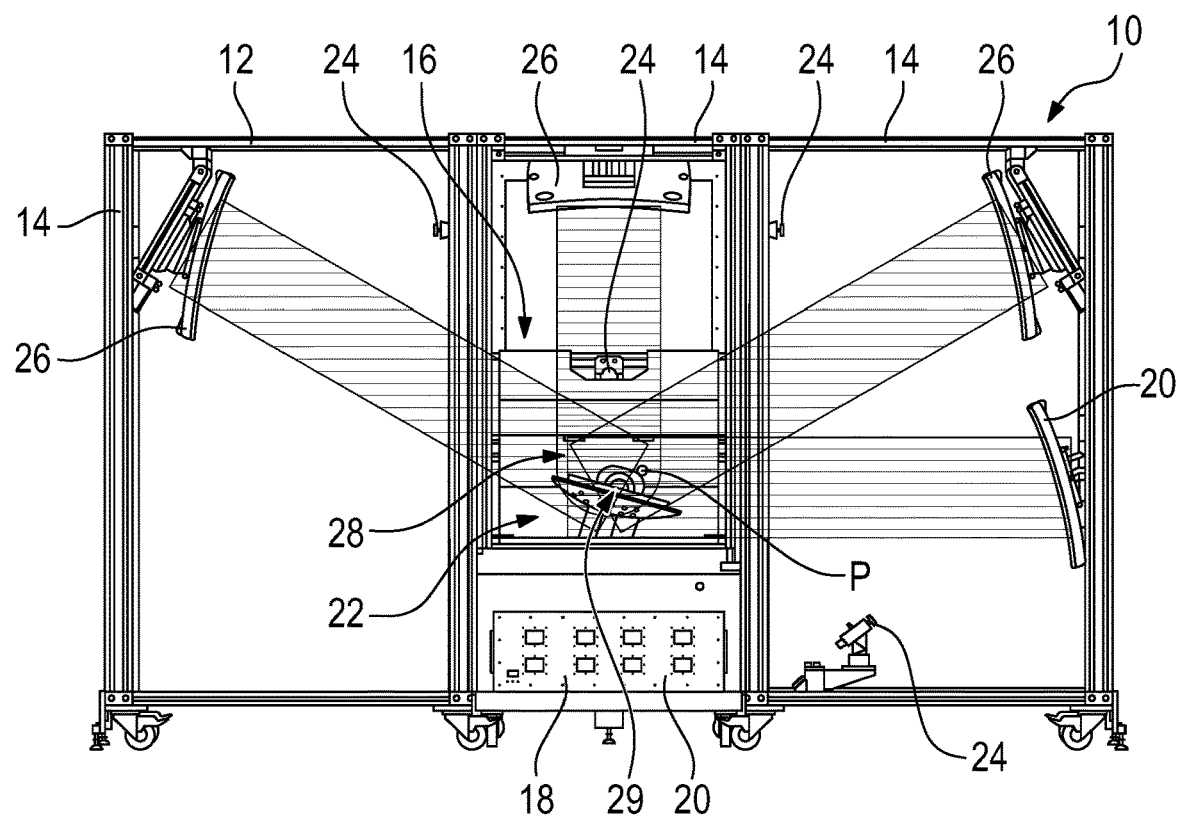
FIG. 1 schematically shows a measurement system according to an embodiment of the present disclosure.

In FIG. 1, a measurement system 10 is shown that comprises a test chamber 12 established by three different modules 14 that can be interconnected with each other, thereby establishing a common testing space 16 that is encompassed by the entire test chamber 12 as shown in FIG. 1.

As shown in FIG. 1, the measurement system 10 comprises a signal generation and/or analysis equipment 18 as well as a control equipment 20. In some embodiments, the signal generation and/or analysis equipment 18 as well as a control equipment 20 includes circuitry (e.g., hardware circuits, software circuits, or combinations thereof). The circuitry of the signal generation and/or analysis equipment 18 as well as a control equipment 20 is suitably configured in order to carry out one or more of, or all of, the functionality of these devices described herein.

The control equipment 20 is connected with a positioning system 22 in a signal-transmitting manner such that the control equipment 20 is able to output control signals that are forwarded to the positioning system 22 as will be described later in more detail.

The measurement system 10 further comprises several measurement antennas 24 that are located within the test chamber 12. The measurement antennas 24 are orientated towards respective reflectors 26 that are mounted on an inner wall of the test chamber 12, e.g. in an adjustable manner such that their angular orientation can be set, for instance automatically by the control equipment 20.

The measurement antennas 24 are connected with the signal generation and/or analysis equipment 18 in a signal transmitting manner, thereby ensuring that signals generated by the signal generation equipment 18 are forwarded to the measurement antennas 24 for being emitted appropriately. Furthermore, signals received by the measurement antenna 24 can be forwarded to the analysis equipment 18 in order to be analyzed appropriately.

As shown in FIG. 1, the reflectors 26 are orientated such that they face the positioning system 22 which is associated with a quiet zone 28. Within the quiet zone 28, a device 29 to be positioned by the positioning system 22 is located, for example a device under test to be analyzed by the measurement system 10.

Figure 2:
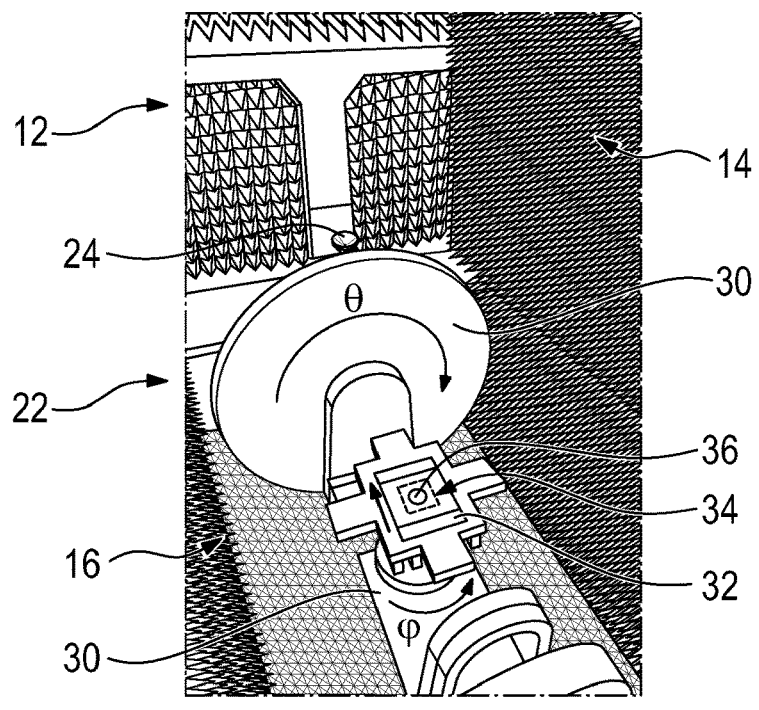
FIG. 2 schematically shows a positioning system used by the measurement system of FIG. 1 in more detail.

The positioning system 22 is generally configured to move the device 29 to any three-dimensional Cartesian point, for example within the quiet zone 28. For this purpose, the positioning system 22, which is shown in FIG. 2 in more detail, comprises at least two rotational positioner modules 30 as well as one linear positioner module 32. In some embodiments, each rotational positioner module 30 includes a controllable rotational stage and the linear positioner module 32 includes a controllable linear stage. In some embodiments, the rotational stages and the linear stage are configured to operate in response to receipt of the control signals from the control equipment 20.

The rotational positioner modules 30 are generally configured to perform a rotational movement as indicated by the curved arrows, thereby rotating the device 29, for instance along elevation direction and/or the azimuth direction. The linear positioner module 32 forms a linear movement such that the device 29 is moved translationally. This is illustrated in FIG. 2 by the straight arrow.

In addition, the linear positioner module 32 comprises a mounting interface 34 for the device 29 such that the linear positioner module 32 is the positioner module of the three different positioner modules 30, 32 that is located closer to the device 29 than the other ones.

The mounting interface 34 may directly hold the device 29. Alternatively, the mounting interface 34 is configured to be engaged by a holding member 36 (dashed lines in FIG. 2), e.g. a coupling or rather adapter module, via which the device 29 can be held. In any case, the device 29 is mounted to the positioning system 22 via the linear positioning module 32 that is located inside the rotation positioning modules 30 as illustrated in FIG. 2.

In general, the positioner modules 30, 32 together are configured to move the device 29 from a starting point of the movement along different measurement positions to an endpoint, wherein several measurements can be performed during the respective movement, namely at different measurement positions.

The rotational positioner modules 30 that are located outwardly compared to the linear positioner module 32 are configured to set the starting point of the movement. The linear positioner module 32 is configured to move the mounting interface 34 relative to the starting point of the movement.

Therefore, the device 29 can be moved during the testing by the different positioner modules 30, 32 such that different measurement positions can be reached.

In other words, the linear positioner module 32 is located within the rotational positioner modules 30, as the linear positioner module 32 is mechanically connected with at least one of the rotational positioner modules 30 such that the linear positioner module 32 is also moved by the respective rotational positioner module 30 in case that the device 29 is moved.

For instance, the different rotational positioner modules 30 are arranged such that one of both rotational positioner modules 30 is an interposed positioner module, as it is connected with the other rotational positioner module 30 and the linear positioner module 32.

In some embodiments, the outermost rotational positioner module 30 may be associated with the azimuth direction or rather the elevation direction, whereas the interposed rotational positioner module 30 is associated with the other direction. Hence, it is ensured that both rotational positioner modules 30 together can rotate the device 29 along two different axes, which are perpendicular with respect to each other.

In any case, the linear positioner module 32 is the innermost positioner module of the positioning system 22 that may directly interact with the device 29.

In general, the device 29 to be positioned, e.g. the device under test, may be located offset from a center of the coordinate system as indicated in FIG. 1 by the point labeled P.

Even though the device 29 is located offset from the center, it is ensured that the measurement system 10 can perform measurements of two signals at two different angles of arrival (AoA) by a coordinate transformation from Cartesian coordinates to spherical coordinates based on two rotation angles associated with the rotational positioner modules 30 and the radius associated with the linear positioner module 32.

In some embodiments, a Cartesian to spherical transformation may be used while calculating a corresponding radius for the linear positioner module 32 to move the device 29 such that the device 29 is enabled to receive two or more radio frequency signals from multiple angles of arrival (AoA) without an increase in measurement uncertainty. As mentioned above, the respective radio frequency signals may arrive from different reflectors 26 or from the same reflector 26 using offset measurement antennas 20, namely measurement antennas 20 that are located offset from the focal point of the respective reflector 26.

Hence, the rotational positioner modules 30 may be used to set the starting point of the movement, wherein the linear positioner module 32 is controlled such that the device 20 reaches a measurement position that allows receiving two or more radio frequency signals simultaneously from different angles of arrival (AoA). Hence, the device 29 is translationally moved by the linear positioner module 32.

Generally, a compensation of the quiet zone 28 can be done by the method.

Certain embodiments disclosed herein, for example the respective signal generation and/or analysis equipment 18, the control equipment 20, etc., utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A measurement system for performing measurements, the measurement system comprising a positioning system for positioning at least one device to be positioned, the positioning system comprising:
    at least two rotational positioners configured to perform a rotational movement, thereby rotating the device to be positioned; and
    at least one linear positioner configured to perform a linear movement, thereby translationally moving the device to be positioned,
    wherein the linear positioner comprises a mounting interface for the device to be positioned;
    wherein the rotational positioners and the linear positioner together are configured to move the device to be positioned from a starting point of the movement;
    wherein the rotational positioners are configured to set the starting point;
    wherein the linear positioner is configured to move the mounting interface relative to the starting point, and
    wherein the measurement system is configured to perform measurements of two signals at two difference angles of arrival.

2. The measurement system according to claim 1, wherein the linear positioner is located within the rotational positioners.

3. The measurement system according to claim 1, wherein the positioning system is configured to move the device to be positioned to any three-dimensional Cartesian point.

4. The measurement system according to claim 1, wherein at least one of the rotational positioners is configured to position the starting point in at least one of azimuth direction and elevation direction.

5. The measurement system according to claim 1, wherein the linear positioner is mechanically connected with at least one of the rotational positioners such that the linear positioner is moved by the respective rotational positioner.

6. The measurement system according to claim 1, wherein the linear positioner is directly connected with the rotational positioner configured to perform the rotational movement along the azimuth direction, and wherein the rotational positioner configured to perform the rotational movement along the azimuth direction is directly connected with the rotational positioner configured to perform the rotational movement along the elevation direction.

7. The measurement system according to claim 1, wherein the linear positioner is directly connected with the rotational positioner configured to perform the rotational movement along the elevation direction, and wherein the rotational positioner configured to perform the rotational movement along the elevation direction is directly connected with the rotational positioner configured to perform the rotational movement along the azimuth direction.

8. The measurement system according to claim 1, wherein the mounting interface is configured to directly hold the device to be positioned.

9. The measurement system according to claim 1, wherein the mounting interface is configured to be engaged by a holding member that is configured to hold the device to be positioned.

10. The measurement system according to claim 1, wherein the at least one device to be positioned corresponds to a device under test or a radio frequency receiving device used for testing a device under test or a radio frequency transmitting device used for testing a device under test.

11. The measurement system according to claim 1, wherein a control equipment is provided that is connected with the rotational positioners and the linear positioner, and wherein the control equipment includes circuitry configured to output control signals to control the rotational positioner and the linear positioner.

12. The measurement system according to claim 1, wherein a plurality of measurement antennas is provided.

13. The measurement system according to claim 1, further comprising a signal generation and/or analysis equipment that includes circuitry configured to at least one of generate measurement signals to be emitted via the measurement antennas or to analyze measurement signals received via the measurement antennas.

14. The measurement system according to claim 13, wherein the circuitry of the analysis equipment is further configured to perform a coordinate transformation from Cartesian coordinates to spherical coordinates based on two rotation angles associated the rotational positioners and a radius associated with the linear positioner.

15. The measurement system according to claim 1, further comprising a test chamber, and wherein the rotational positioners and the linear positioner are located within the test chamber.

16. The measurement system according to claim 1, wherein at least one reflector is provided that is orientated towards the mounting interface.

17. The measurement system according to claim 16, wherein the at least one reflector is arranged at an inner wall of a test chamber that encompasses the rotational positioners and the linear positioner.

18. The measurement system according to claim 16, wherein two measurement antennas are orientated towards the at least one reflector.

19. A measurement system for performing measurements, the measurement system comprising:
   a positioning system for positioning at least one device to be positioned, the positioning system comprising:
   at least two rotational stages configured to perform a rotational movement, thereby rotating the device to be positioned; and
   at least one linear stage configured to perform a linear movement, thereby translationally moving the device to be positioned,
   wherein the linear stage comprises a mounting interface for the device to be positioned;
   wherein the linear stage is located within the rotational stages; and
   wherein the measurement system is configured to perform measurements of two signals at two different angles of arrival.

20. A measurement system for performing measurements, the measurement system comprising:
   a positioning system for positioning at least one device to be positioned, the positioning system comprising at least two rotational positioner modules configured to perform a rotational movement, thereby rotating the device to be positioned, and at least one linear positioner module configured to perform a linear movement, thereby translationally moving the device to be positioned,
   wherein the linear positioner module comprises a mounting interface for the device to be positioned,
   wherein the rotational positioner modules and the linear positioner module together are configured to move the device to be positioned from a starting point of the movement,
   wherein the rotational positioner modules are configured to set the starting point,
   wherein the linear positioner module is configured to move the mounting interface relative to the starting point, and
   wherein at least one of the rotational positioner modules is configured to position the starting point in at least one of azimuth direction or elevation direction.

* * * * *